(12) United States Patent
Hsiao et al.

(10) Patent No.: US 6,291,279 B1
(45) Date of Patent: Sep. 18, 2001

(54) METHOD FOR FORMING DIFFERENT TYPES OF MOS TRANSISTORS ON A SEMICONDUCTOR WAFER

(75) Inventors: Hsi-Mao Hsiao, Hsin Chu; Chun-Lung Chen, Tai-Nan Hsien; Chia-Fu Yeh, Taipei; Jung-Huang Chen, Chung-Ho, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/584,700

(22) Filed: Jun. 1, 2000

(51) Int. Cl.$^7$ ..................... H01L 21/336; H01L 21/8234
(52) U.S. Cl. ................... 438/197; 438/210; 438/238; 438/239; 438/257; 438/592; 438/664
(58) Field of Search ..................... 438/197, 238, 438/239, 241, 253, 396, 258, 655, 305, 306, 279, 595, 976, 210, 257, 275, 592, 597, 648, 649, 651, 656, 663, 664, 682, 683, 685

(56) References Cited

U.S. PATENT DOCUMENTS 5,972,764 * 10/1999 Huang et al. ..................... 438/305
6,037,222 * 3/2000 Huang et al. ..................... 438/257
6,074,915 * 6/2000 Chen et al. ..................... 438/258
6,136,677 * 10/2000 Prein ..................... 438/592
6,153,459 * 11/2000 Sun ..................... 438/238
6,235,574 * 5/2001 Tobben et al. ..................... 438/241

* cited by examiner

*Primary Examiner*—Matthew Smith
*Assistant Examiner*—Igwe U. Anya
(74) *Attorney, Agent, or Firm*—Winston Hsu

(57) ABSTRACT

A semiconductor wafer has a substrate, a first region in the substrate that is used for a logic circuit, and a second region in the substrate that is used for a memory cell. A first gate in the first region and a second gate in the second region are simultaneously formed on the substrate. The first gate and the second gate both include a gate dielectric layer, a polysilicon layer, a tungsten silicide layer and a cap layer, in ascending order. The cap layer and the tungsten silicide layer are then removed from the first gate. A spacer around each gate is then formed. This completes the second type MOS transistor in the memory cell of DRAM. A titanium silicide layer on the surface of the substrate adjacent to the first gate and on the surface of the polysilicon layer of the first gate is formed so as to complete the formation of the first type MOS transistor.

15 Claims, 6 Drawing Sheets

METHOD FOR FORMING DIFFERENT TYPES OF MOS TRANSISTORS ON A SEMICONDUCTOR WAFER

BACKGROUND OF THE INVENTION

1. Field of the Invention

The present invention relates to a method for forming a MOS transistor on a semiconductor wafer, and more particularly, to a method for forming MOS transistors with a plurality of different types in a dynamic random access memory (DRAM).

2. Description of the Prior Art

A DRAM consists of thousands, or even millions, of memory cells, as well as a logic circuit. Each memory cell includes a MOS transistor and a capacitor, and the logic circuit has a plurality of MOS transistors. The demands of the memory cell and the logic circuit are different, so the MOS transistors in these different regions have different structures, too. However, in order to reduce process steps, the same MOS structure and the same silicide material are used to form the MOS transistors in the two regions in the present DRAM manufacturing method. However, this is now no longer sufficient to meet the demands of the different circuits.

Please refer to FIG. 1 to FIG. 6. FIG. 1 to FIG. 6 are schematic diagrams of the method for forming different types of MOS transistors 60, 62 in a DRAM on a semiconductor wafer 10 according to the prior art. As shown in FIG. 1, the semiconductor wafer 10 includes a silicon substrate 12. There are two areas 26 and 28 positioned on the silicon substrate 12. The region of area 26 is used for a logic circuit of the DRAM, and the region of area 28 is used for memory cells of the DRAM.

In the prior art method, a thermal oxidation process is performed to form a silicon dioxide layer 14 on surface of the silicon substrate 12. A chemical vapor deposition (CVD) process is then performed to deposit a polysilicon layer 16 on the surface of the silicon dioxide layer 14. The polysilicon layer 16 is then doped. A sputter process is then performed to form a titanium nitride layer 18 and a titanium silicide layer 20 on the polysilicon layer 16 in order. A CVD process is then performed to deposit a silicon nitride layer 22 on the surface of the titanium silicide layer 20.

A photoresist layer is coated on the silicon nitride layer 22, and a lithographic process is performed to define the pattern of the gate in the areas 26 and 28. The excess portions of the photoresist layer are then removed, and the residual photoresist 24 as shown in FIG. 1 is used as a hard mask in the subsequent etching process.

As shown in FIG. 2, a dry etching process is performed to remove the portions which are not covered by the photoresist 24 so as to form a gate 30 in the area 26 and two gates 32 in the area 28 on the silicon substrate 12. The photoresist layer 24 is then stripped. Each of the gates 30, 32 includes a gate oxide layer 34, a doped polysilicon layer 36, a titanium nitride layer 38, a titanium silicide layer 40 and a cap layer 42.

As show in FIG. 3, a low pressure CVD process is performed to form a silicon oxide layer 44 on the surface of the silicon substrate 12 and on the surface of the gates 30, 32. An ion implantation process is then performed to form doped regions 46 in the substrate 12 adjacent to the gates 30, 32. The doped regions 46 are used as lightly doped drains (LDD) of the MOS transistors. A CVD process is then performed to deposit a silicon nitride layer 48 on the silicon oxide layer 44 that covers the gates 30, 32 uniformly.

As shown in FIG. 4, an anisotropic dry etching process is performed to remove the silicon nitride layer 48 so as to form spacers 50 on each wall of gates 30, 32. An ion implantation process is then performed to form doped regions 52. The doped regions 52 are used as sources and drains of the MOS transistors. The MOS transistor 60 in the memory cell of DRAM is then completely formed.

As shown in FIG. 5, a silicon nitride layer (not shown) is deposited on the silicon substrate 12. A lithographic process is then performed to cover the area 28. An etching process is performed to remove the silicon nitride layer in the area 26. The residual silicon nitride layer 54 in the area 28, as shown in FIG. 5, is used as a mask in the subsequent process for forming a titanium silicide layer in the area 26. A cleaning process is used to completely remove the residual silicon oxide layer 44 in the area 26 of the silicon substrate 12. A sputtering process is then performed to form a titanium layer 56 and a titanium nitride layer 58 on the semiconductor wafer 10.

As shown in FIG. 6, a rapid thermal process (RTP) is performed to cause the titanium layer 54 react with the silicon atoms in the area 26 of the silicon substrate 12 so as to form titanium silicide layers 64. The residual titanium layer 56 and the residual titanium nitride layer 58 are then removed. The MOS transistor 62 in the logic circuit of DRAM is completely formed.

After the formations of the MOS transistors 60, 62 in the memory region 28 of DRAM and in the logic circuit region 26 of DRAM, other semiconductor processes can subsequently be performed. This may include forming a dielectric layer on the semiconductor, and then forming contact plugs to electrically connect to the MOS transistors 60, 62.

Because the demands of operational speed in the logic circuit of a DRAM are stricter, controlling the resistance of the gate 30 in the MOS transistor 62 becomes the most important aspect of the MOS transistor 62. Conversely, with the reducing semiconductor line width, the primary concerns for the gate 32 in the MOS transistor 60, which is used for a memory cell 28, is keeping the shape of the gate 32 and etching uniformity.

In order to reduce the resistance of the gate 30 in the logic circuit 26, titanium silicide is commonly used as the material for the silicide layer. However, a titanium silicide layer is not easy to etch, making it more difficult to ensure the shape and uniformity of the MOS transistor 60. In another method, the different types of MOS transistors are formed separately. This method, however, requires more complex process steps, and is not good in embedded processes.

SUMMARY OF THE INVENTION

It is therefore a primary objective of the present invention to provide a method for forming MOS transistors with a plurality of different types on a semiconductor wafer so as to embed the process of forming the MOS transistor of the memory cell of a DRAM and the process of forming the MOS transistor of the logic circuit of the DRAM.

In the preferred embodiment of the present invention, the semiconductor wafer comprises a substrate, a first region positioned on the substrate that is used for a logic circuit, and a second region positioned on the substrate that is used for a memory cell. Simultaneously, on the substrate, a first gate in the first region and a second gate in the second region are formed. The first gate and the second gate both include a gate dielectric layer, a polysilicon layer, a tungsten silicide layer and a cap layer, in ascending order. The cap layer and the tungsten silicide layer are removed from the first gate. A first ion implantation process is then performed to form doped regions in the substrate adjacent to each of the gates. The doped regions are used as lightly doped drains (LDD) of the MOS transistors. A spacer around each gate is then formed. A second ion implantation process is performed to form doped regions. The doped regions are used as sources and drains of the MOS transistors. The second type MOS transistor in the memory cell of the DRAM is then completely formed. A titanium silicide layer on the surface of the substrate adjacent to the first gate and on the surface of the polysilicon layer of the first gate is formed so as to complete the formation of the first type MOS transistor of the DRAM.

The present invention method combines two advantages for satisfying the differing demands of the logic circuit and the memory cells. In the logic circuit, titanium is employed because of its low resistance and high transmitting speed. In the memory region, tungsten is employed to maintain the shape of the gate and ensure good etching uniformity. The present invention method thus both simplifies the process steps and satisfies the different electric demands of different regions.

These and other objectives of the present invention will no doubt become obvious to those of ordinary skill in the art after reading the following detailed description of the preferred embodiment, which is illustrated in the various figures and drawings.

DETAILED DESCRIPTION OF THE PREFERRED EMBODIMENT

Figure 1:
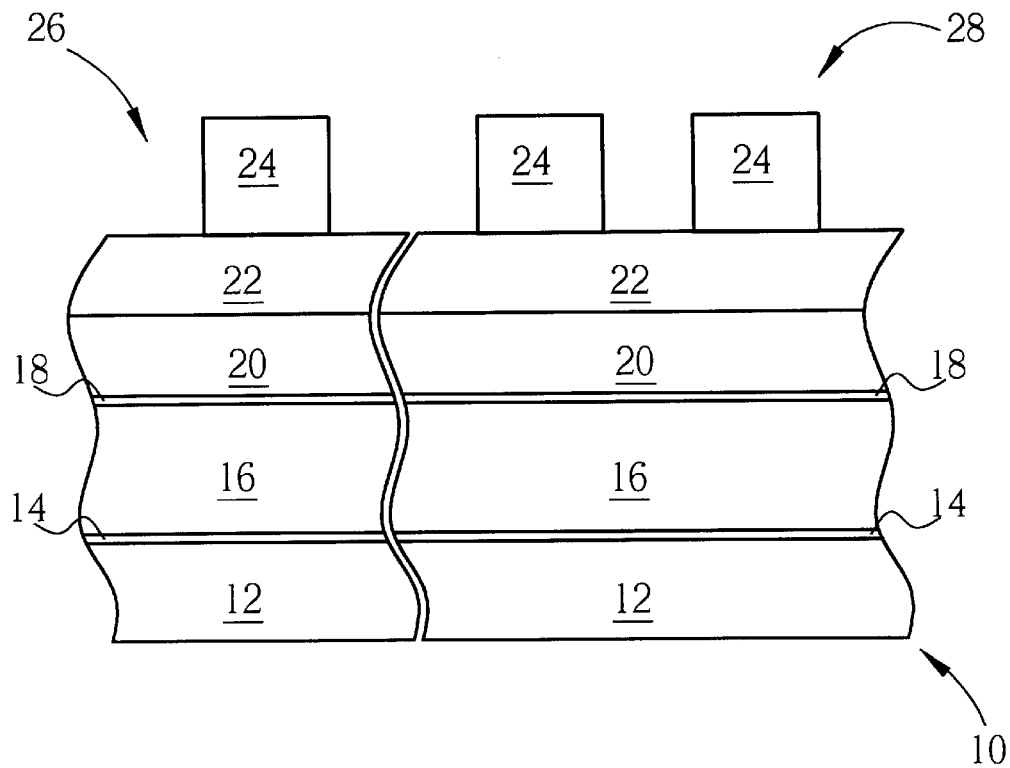
FIG. 1 to FIG. 6 are schematic diagrams of a method for forming different types of MOS transistors in a DRAM on a semiconductor wafer according to the prior art.
Figure 2:
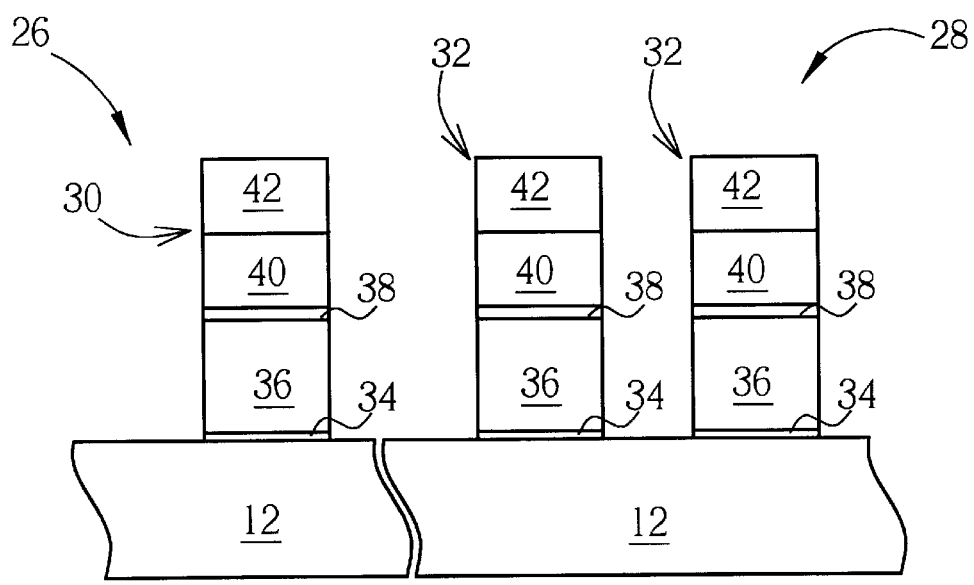
Figure 3:
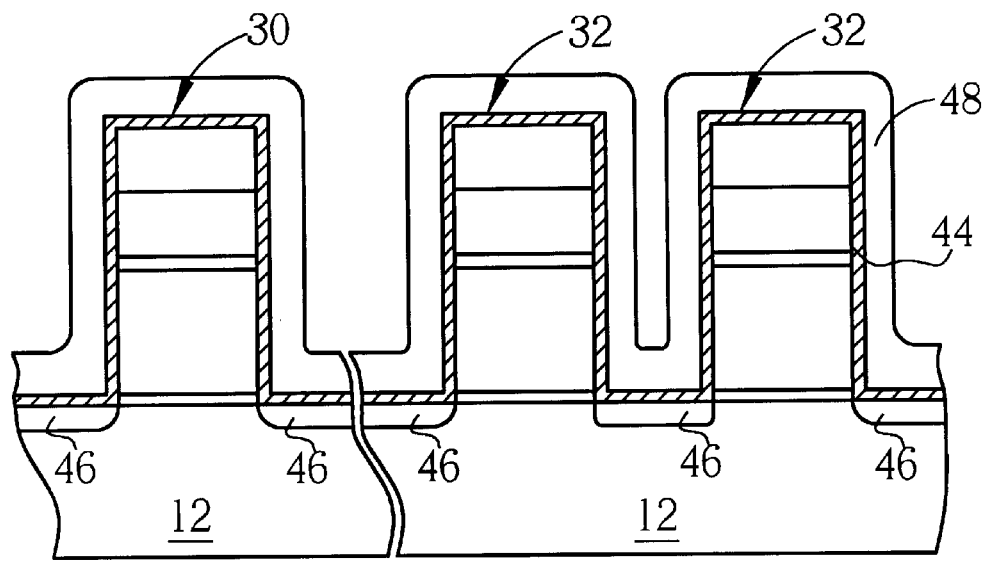
Figure 4:
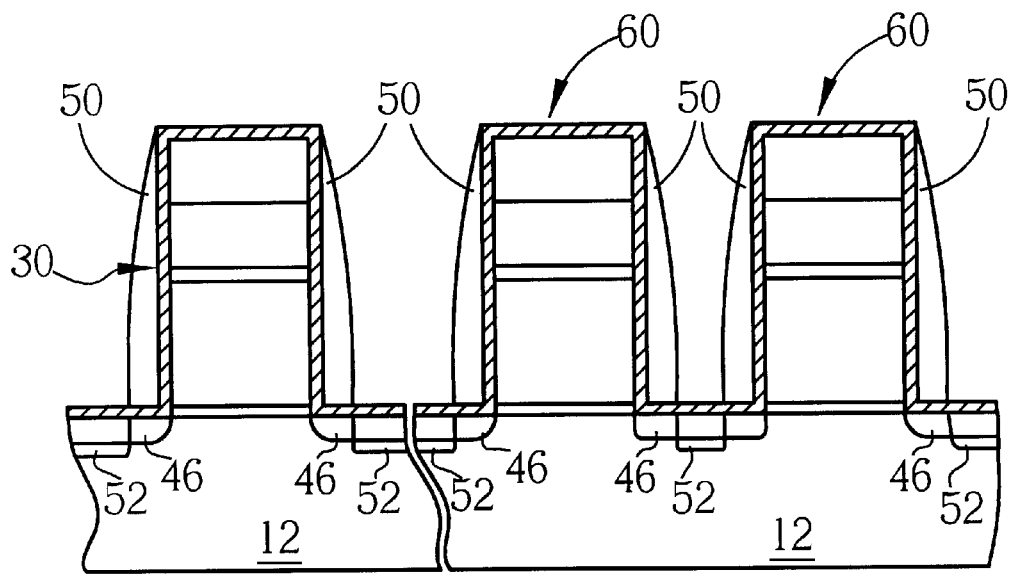
Figure 5:
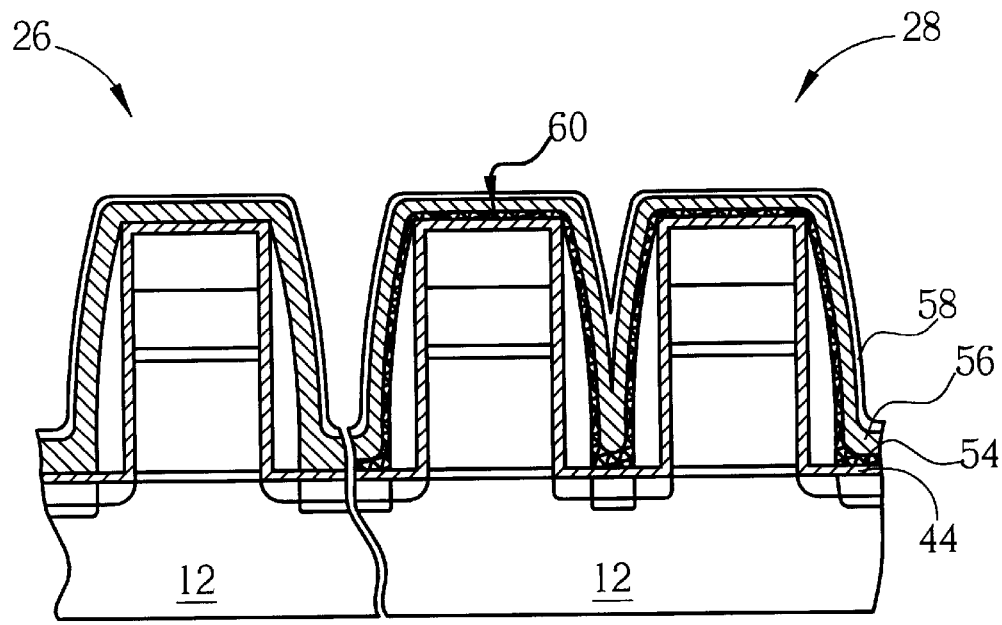
Figure 6:
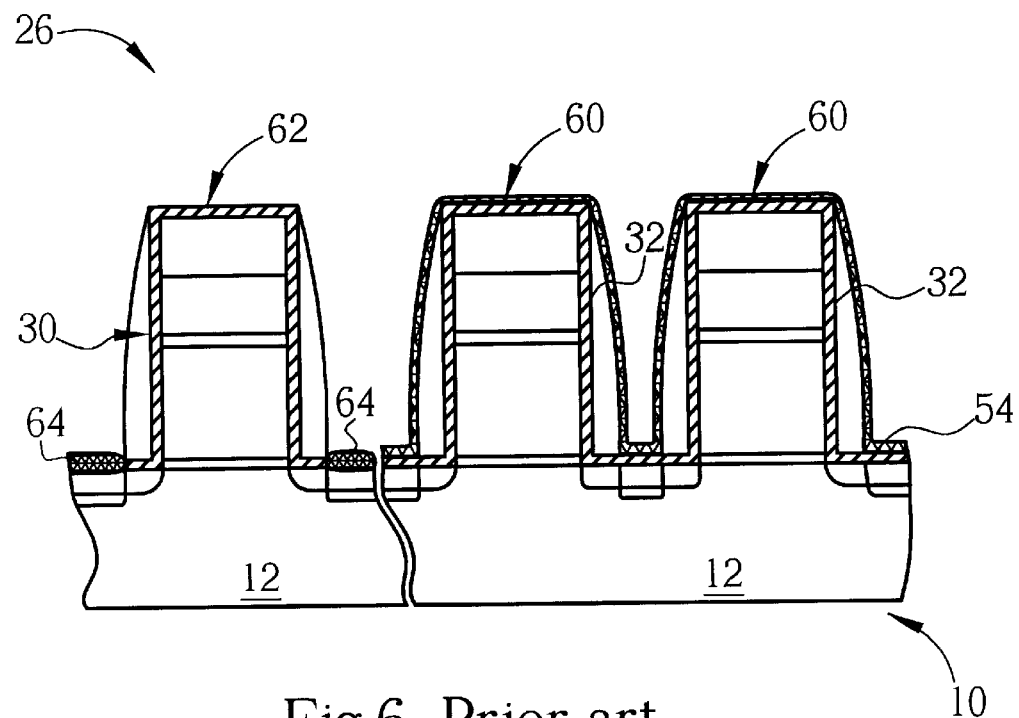
Figure 7:
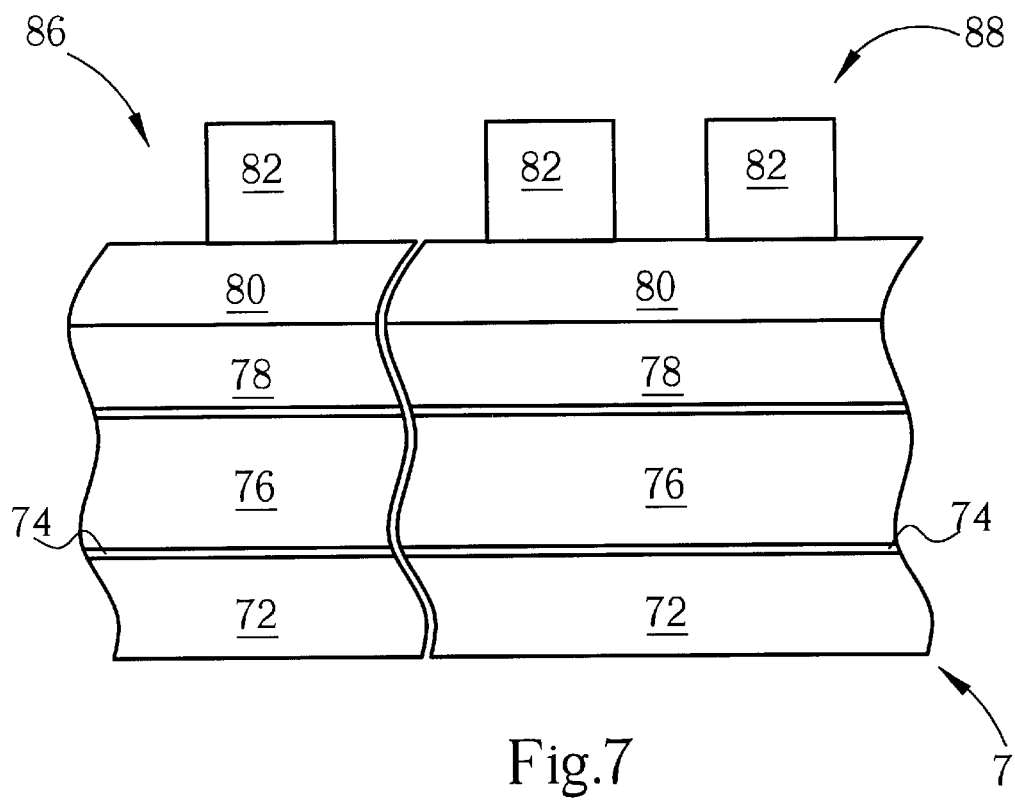
FIG. 7 to FIG. 12 are schematic diagrams of the method for forming different types of MOS transistors in a DRAM on a semiconductor wafer according to the present invention.

Please refer to FIG. 7 to FIG. 12. FIG. 7 to FIG. 12 are schematic diagrams of the method for forming different types of MOS transistors 114, 124 in a DRAM on a semiconductor wafer 70 according to the present invention. As shown in FIG. 7, the semiconductor wafer 70 includes a silicon substrate 72. There are two areas, 86 and 88, positioned on the silicon substrate 72. The area 86 is used for a logic circuit of DRAM, and the area 88 is used for memory cells of the DRAM.

In the present invention method, a thermal oxidation method is performed to form a silicon dioxide layer 74 on the surface of the silicon substrate 72. The silicon dioxide layer 74 has a thickness of about 33 Å. A chemical vapor deposition (CVD) process is then performed to deposit a polysilicon layer 76 on the surface of the silicon dioxide layer 74. The polysilicon layer 76 has a thickness of about 2000 Å. In order to reduce the resistivity of the polysilicon layer 76, the polysilicon layer 76 is then doped. The doping process can be performed in-situ during the deposition process, or can be performed using thermal diffusion to drive the dopants into the polysilicon layer 76, or an ion implantation method can be used to implant dopants into the polysilicon layer 76.

A sputtering method is then performed to form a tungsten silicide layer 78 on the polysilicon layer 76. The tungsten silicide layer 78 has a thickness of about 1000 Å. A CVD process is then performed to deposit a silicon nitride layer 80 of 1500 Å on the surface of the tungsten silicide layer 78. A photoresist layer is coated onto the silicon nitride layer 80, and a lithographic process is performed to define the patterns of the gates in the areas 86 and 88. The excess portions of the photoresist layer are removed, and the residual photoresist 82, as shown in FIG. 7, is used as a hard mask in the subsequent etching process.

Figure 8:
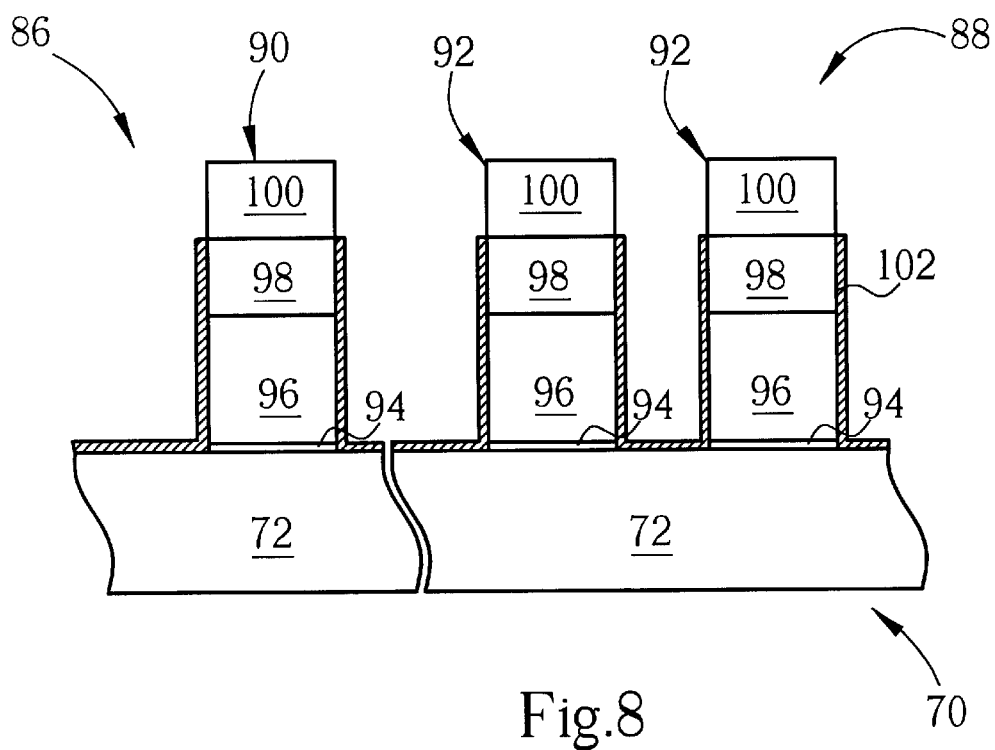

As shown in FIG. 8, a dry etching process is performed to remove the portions that are not covered by the photoresist 82 so as to form on the silicon substrate 72 a gate 90 in the area 86 and two gates 92 in the area 88. The photoresist layer 82 is then stripped. Each of the gates 90, 92 includes a gate oxide layer 94, a doped polysilicon layer 96, a tungsten nitride layer 98, and a cap layer 100.

A thermal oxidation process is then performed to form a silicon oxide layer 102 over the surface in those portions that comprise free silicon atoms, such as the surface of the silicon substrate 72 and the walls of the doped polysilicon layer 96 and the tungsten silicide layer 98. The silicon oxide layer 102 is used as a sacrificial oxide in the subsequent ion implantation process to prevent channeling. The silicon oxide layer 102 can also be used as a liner oxide layer to increase the adhesion of the subsequent silicon nitride layer.

Figure 9:
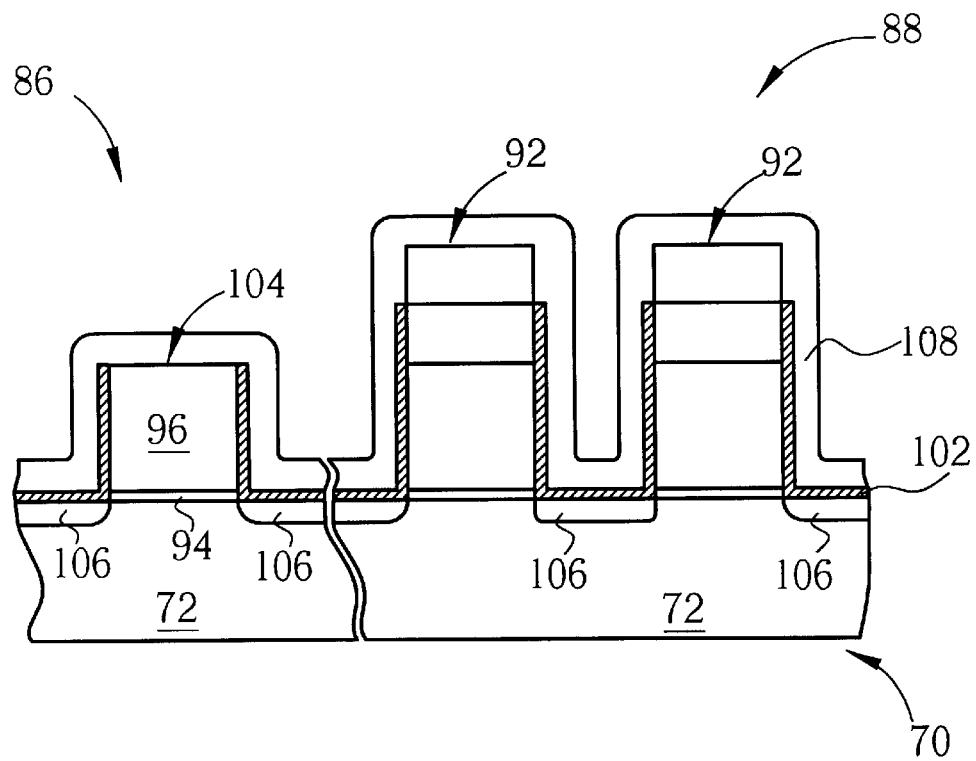

As shown in FIG. 9, a photoresist (not shown) layer is used to cover the area 88, and a plasma etching process is performed using carbon tetrafluoride ($CF_4$) and oxygen as etching gases to remove the cap layer 100 of silicon nitride from the top of the gate 90. In this etching process, the silicon oxide layer 102 is used to protect both the silicon substrate 72 and the tungsten silicide layer 98 so as to prevent damage to other devices. The etching selectivity between the silicon nitride and the silicon oxide layer 102 is selected to be greater than 40:1. The tungsten silicide layer 98 of the gate 90 is then removed using an RCA cleaning solution. Portions of the silicon oxide layer 102 may also be etched by this process. The photoresist layer is then stripped. At this stage, the gate 104 in the area 86 consists of the gate oxide layer 94 and the doped polysilicon layer 96.The walls of the gate 104 will have the silicon oxide layer 102 on them.

An ion implantation process is then performed to form doped regions 106 in the silicon substrate 72 adjacent to the gates 90, 104. The doped regions 106 are used as lightly doped drains (LDD) of the MOS transistors. Before the ion implantation process is performed, a CVD process can be performed to deposit another silicon oxide layer, which is used as a sacrificial layer to ensure the quality of the silicon substrate 72. A CVD process is then performed to deposit a silicon nitride layer 108 that uniformly covers the gates 92, 104.

Figure 10:
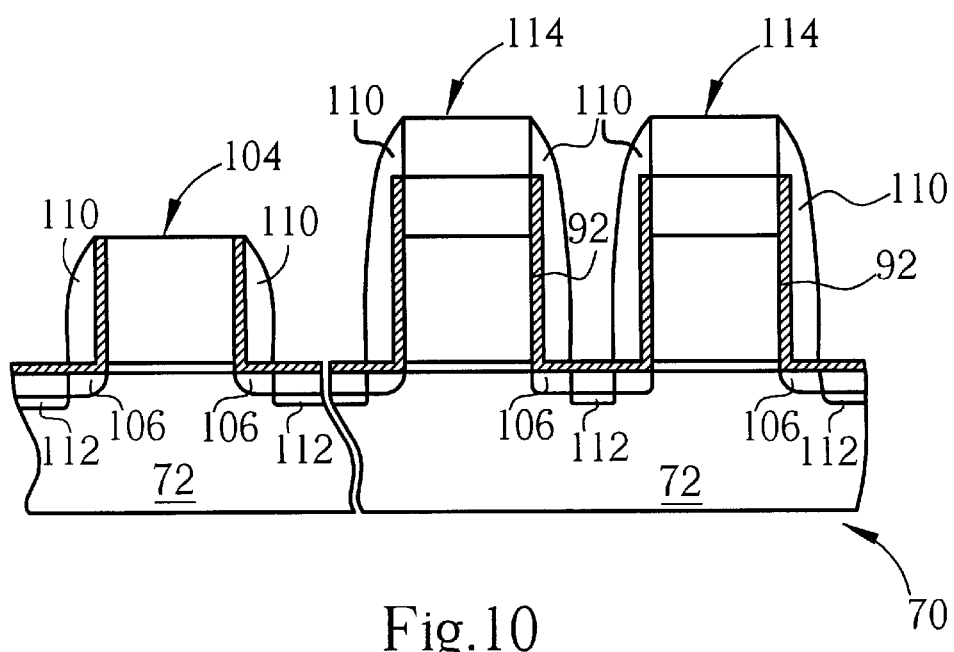

As shown in FIG. 10, an anisotropic dry etching process is performed to remove the silicon nitride layer 108 so as to form spacers 110 on each wall of gates 92, 104. An ion implantation process is then performed to form doped regions 112. The doped regions 112 are used as sources and drains of the MOS transistors. The MOS transistor 114 in the memory cell of DRAM is then completely formed.

Figure 11:
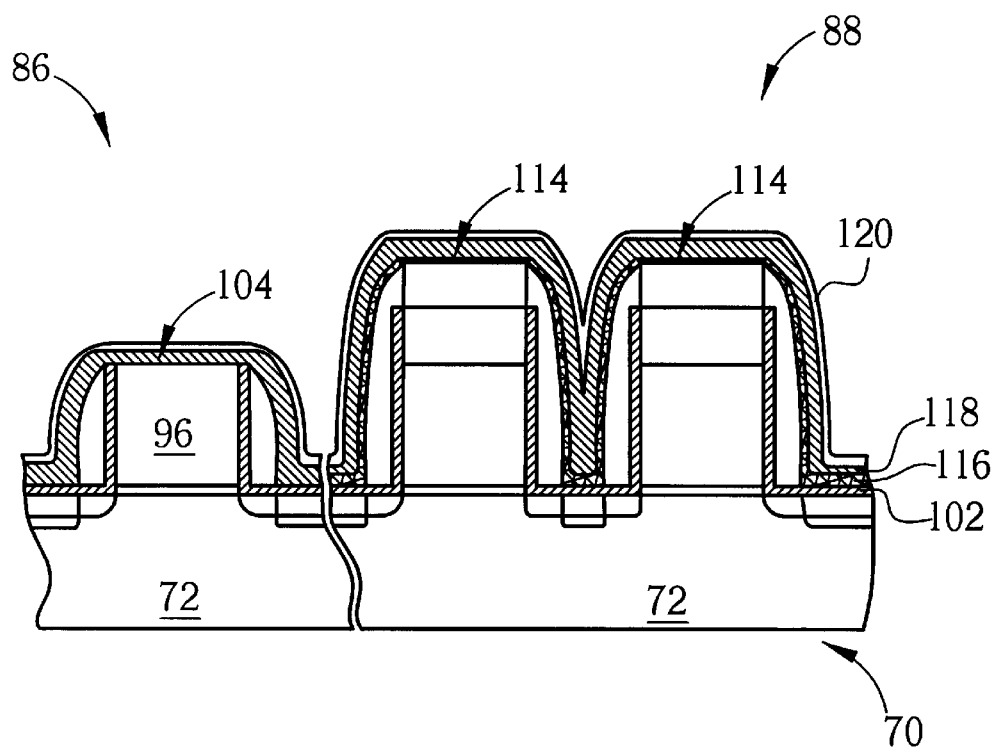

As shown in FIG. 11, a silicon nitride layer (not shown) is deposited on the silicon substrate 72. A lithographic process is performed to cover the area 88. An etching process is performed to remove the silicon nitride layer from the area 86. A residual silicon nitride layer 116 in the area 88 as shown in FIG. 11 is used as a mask in the subsequent process for forming a titanium silicide layer in the area 86.

A cleaning process is used to completely remove the residual silicon oxide layer 102 in the area 86 from the silicon substrate 72. A sputtering process is then performed to form on the semiconductor wafer 70 a titanium layer 118 with a thickness of about 300 Å, and a titanium nitride layer 120 with a thickness of about 200 Å. The titanium nitride layer 120 prevents the surface of the titanium layer 116 from reacting with oxygen, and is also used to ensure a uniform titanium silicide layer.

Figure 12:
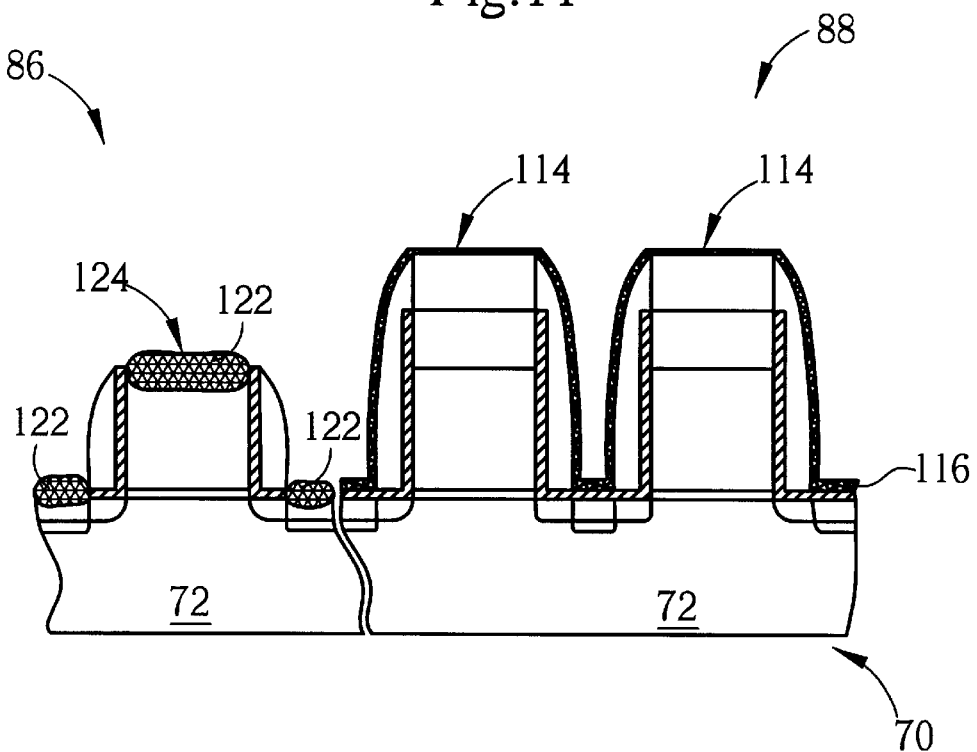

As shown in FIG. 12, a rapid thermal process (RTP) is performed to cause the titanium layer 116 to react with both the silicon atoms in the area 86 of the silicon substrate 72 and the doped polysilicon layer 96 of the gate 104 so as to form titanium silicide layers 122. The RTP process is a two-phase thermal process. The temperature in the first thermal phase is about 600° C. to 640° C., and the temperature of the second thermal phase is about 730° C to 770° C. The residual titanium layer 116 and the residual titanium nitride layer 118 are then removed using a sulfuric acid solution and an RCA solution. An annealing process of about 825° C. is performed to collocate the atoms of the silicon substrate 72. The MOS transistor 62 that is used for the logic circuit of a DRAM is then completely formed.

After the formations of the MOS transistors 114 and 124, other semiconductor processes can subsequently be performed, such as forming a dielectric layer on the semiconductor wafer and then contact plugs to electrically connect to the MOS transistors 114, 124.

In the present invention, the gates 90 and 92, having the same structure, are formed in the memory region 88 and in the logic circuit region 86 using tungsten silicide. The silicon nitride layer 100 and the tungsten silicide layer 98 of the gate 90 in the logic circuit region 86 are then removed. Finally, a titanium silicide layer is formed in the logic circuit region 86. The resistance of titanium is low, and tungsten is easy to etch. The present invention method combines these two advantages to suit the different demands of the logic circuit 86 and the memory cell 88. In the logic circuit 86, titanium is used because of its low resistance and high transmitting speed; conversely, in the memory region 88, tungsten is used to ensure the shape of the gate and good etching uniformity. Hence, the present invention method simplifies both the process steps and satisfies the differing electric demands of the different regions.

In contrast to the prior art method, the present invention method satisfies the speed demands in the logic circuit, and ensures that the silicide layer is easily etched in the memory region.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method for forming metal-oxide semiconductor (MOS) transistors with a plurality of different types on a semiconductor wafer, the semiconductor wafer comprising a substrate, the method comprising:

simultaneously forming at least a first gate of a first type MOS transistor and at least a second gate of a second type MOS transistor on the substrate, the first gate and the second gate both comprising a gate dielectric layer, a polysilicon layer, a first silicide layer, and a cap layer in ascending order;

removing the cap layer and the first silicide layer from the first gate;

forming a spacer around each gate, completing the formation of the second type MOS transistor; and forming a second silicide layer on the surface of the substrate adjacent to the first gate and on the surface of the polysilicon layer of the first gate so as to complete the formation of the first type MOS transistor.

2. The method of claim 1 wherein the semiconductor wafer is used in the formation of a dynamic random access memory (DRAM), the first type MOS transistor being used in a logic circuit, and the second type MOS transistor being used in a memory cell.

3. The method of claim 1 wherein the first silicide layer comprises a tungsten silicide layer.

4. The method of claim 1 wherein the method for simultaneously forming the first gate and the second gate comprises:

forming a gate dielectric layer on the substrate;

forming a polysilicon layer on the gate dielectric layer;

forming a first silicide layer on the polysilicon layer;

forming a cap layer on the first silicide layer;

performing a lithographic process to define patterns for the first gate and the second gate; and performing an etching process to remove the excess portions of the cap layer, the first silicide layer, the polysilicon layer, and the gate dielectric layer so as to form the first gate and the second gate.

5. The method of claim 1 wherein the method for forming the spacers comprises:

forming a silicon nitride layer that covers the substrate, the first gate, and the second gate; and etching the silicon nitride layer, the residual silicon nitride layer around the first gate and the second gate forming the spacers.

6. The method of claim 1 wherein the substrate is a silicon substrate, and the second silicide layer is formed using a self-aligned method, the method comprising:

forming a metal layer on the first gate and on the silicon substrate adjacent to the first gate;

performing a thermal process to cause the metal layer to react with both the silicon substrate and the polysilicon layer of the first gate so as to form the second silicide layer; and removing the residual metal layer on the silicon substrate.

7. The method of claim 6 wherein the metal layer is a titanium layer or a cobalt layer.

8. The method of claim 1 wherein after removing the first silicide layer the method further comprises a first ion implantation process, the first ion implantation process being used to form a first doped region in the substrate adjacent to each gate, the first doped region being used as a lightly doped drain (LDD) for the MOS transistor.

9. The method of claim 1 wherein after forming the spacers the method further comprises a second ion implantation process, the second ion implantation process being used to form a second doped region in the substrate adjacent to each gate, the second doped region being used as the source and the drain for the MOS transistor.

10. A method for forming metal-oxide semiconductor (MOS) transistors with a plurality of different types on a semiconductor wafer, the semiconductor wafer being used in the formation of dynamic random access memory (DRAM), the semiconductor wafer comprising a substrate, a first region positioned on the substrate that is used for a logic circuit, and a second region positioned on the substrate that is used for a memory cell, the method comprising:

simultaneously forming on the substrate a first gate in the first region and a second gate in the second region, the first gate and the second gate both comprising a gate dielectric layer, a polysilicon layer, a tungsten silicide layer and a cap layer in ascending order;

removing the cap layer and the tungsten silicide layer from the first gate;

forming a spacer around each gate, completing the formation of the second type MOS transistor; and forming a titanium silicide layer on the surface of the substrate adjacent to the first gate and on the surface of the polysilicon layer of the first gate so as to complete the formation of the first type MOS transistor.

11. The method of claim 10 wherein the method for simultaneously forming the first gate and the second gate comprises:

forming a silicon dioxide layer on the substrate in the first region and in the second region;

forming a polysilicon layer on the silicon dioxide layer;

forming a tungsten silicide layer on the polysilicon layer;

forming a cap layer on the tungsten silicide layer;

performing a lithographic process to define patterns for the first gate and the second gate; and performing an etching process to remove the excess portions of the cap layer, the tungsten silicide layer, the polysilicon layer and the silicon dioxide layer so as to form the first gate and the second gate.

12. The method of claim 10 wherein the method for forming the spacers comprises:

forming a silicon nitride layer that covers the substrate, the first gate, and the second gate; and etching the silicon nitride layer, the residual silicon nitride layer around the first gate and the second gate forming the spacers.

13. The method of claim 10 wherein the substrate is a silicon substrate, and the method for forming the titanium silicide layer comprises:

forming a titanium layer on the silicon substrate in the first region;

performing a thermal process to cause the titanium layer to react with both the silicon substrate and the polysilicon layer of the first gate so as to form the titanium silicide layer; and removing the residual titanium layer from the silicon substrate.

14. The method of claim 10 wherein after removing the tungsten silicide layer the method further comprises a first ion implantation process, the first ion implantation process being used to form a first doped region in the substrate adjacent to each gate, the first doped region being used as a lightly doped drain (LDD) for the MOS transistor.

15. The method of claim 10 wherein after forming the spacers the method further comprises a second ion implantation process, the second ion implantation process being used to form a second doped region in the substrate adjacent to each gate, the second doped region being used as the source and the drain for the MOS transistor.

* * * * *